United States Patent
Lakshmikumar

[11] Patent Number: 5,809,097
[45] Date of Patent: Sep. 15, 1998

[54] LOW JITTER PHASE DETECTOR FOR PHASE LOCKED LOOPS

[75] Inventor: Kadaba R. Lakshmikumar, Basking Ridge, N.J.

[73] Assignee: Lucent Technologies Inc., Murray Hill, N.J.

[21] Appl. No.: 668,884

[22] Filed: Jun. 24, 1996

[51] Int. Cl.$^6$ .................................................. H04L 27/10
[52] U.S. Cl. ........................ 375/376; 329/303; 329/307; 331/1 R; 331/1 A
[58] Field of Search ................................ 327/3, 12, 7, 8, 327/9, 153, 156; 331/1 A, 17, 34, 57, 1 R; 375/211, 215, 316, 327, 355, 376, 377, 371, 228, 226; 329/303, 307

[56] References Cited

U.S. PATENT DOCUMENTS

| | | | |
|---|---|---|---|
| 4,535,459 | 8/1985 | Hogge, Jr. ................................ | 375/80 |
| 5,027,085 | 6/1991 | DeVito ..................................... | 331/1 A |
| 5,271,040 | 12/1993 | Clark ........................................ | 375/327 |
| 5,631,590 | 5/1997 | Tomesakai ................................ | 327/156 |

OTHER PUBLICATIONS

Hogge, Jr., Charles R. *Journal Of Lightwave Technology*, vol. LT–3, No. 6, Dec. 1985 "A Self Correcting Clock Recovery Circuit," pp. 1312–1314.

Lee, Thomas H. et al., *IEEE Journal Of Solid–State Circuits*, vol. 27, No. 12, Dec. 1992, "A 155–MHz Clock Recovery Delay–and Phase–Locked Loop," pp. 1736–1745.

"Self–Correcting Clock Recovery Circuit With Improved Jitter Performance," *Electronics Letter*, 29 Jan. 1987, vol. 23 No. 3, pp. 110–111.

*Primary Examiner*—Stephen Chin
*Assistant Examiner*—Joseph Roundtree

[57] ABSTRACT

A digital phase detector which generates low jitter when the phase-locked-loop is in lock. A delay line, combined with an UP/DOWN phase detector causes substantial overlap in the UP and DOWN signals from the detector. When the PLL is in lock, the overlapping signals substantially cancel each other out, minimizing the variations in the output frequency. Two approaches are disclosed: one delaying the UP signal sufficiently to overlap the DOWN signal, the other using a delay and an exclusive OR gate to generate the DOWN signal.

20 Claims, 3 Drawing Sheets

LOW JITTER PHASE DETECTOR FOR PHASE LOCKED LOOPS

BACKGROUND OF THE INVENTION

1. Field of the invention

This invention relates to phase-locked-loops in general and, more particularly, to phase detectors for phase-locked-loops.

2. Description of the Prior Art

A phase-locked-loop (PLL) as known in the art typically comprise a voltage controlled oscillator (VCO), a phase detector, and a loop filter. The phase detector measures the phase difference between a reference input signal, such as a clock signal or a data signal, and the output signal from the VCO. The output of the phase detector is an error signal that is filtered by the loop filter and the filtered signal is applied to the control input of the VCO. Because of the closed loop nature of a PLL, the output frequency of the VCO is maintained to closely match the frequency of the reference input signal. When the phase difference between the input reference signal and the output of the VCO is approximately some predetermined amount, such as zero radians, the PLL is considered "in lock".

Phase detectors in the prior art, such as the widely used phase detector diagrammed in FIG. 3 and discussed in detail in "A Self Correcting Clock Recovery Circuit" by C. R. Hogge, Journal of Lightwave Technology, Vol. LT-3, No.6, December 1985, pp. 1312–1314, produces jitter on the VCO output while in lock. These kinds of phase detectors dither the VCO output frequency during each transition in the input reference signal as illustrated in FIG. 2. It should be noted that PLLs with other types of phase detectors, such as the multiplying type of phase detector, may also suffer from the same VCO jitter that results from use of the phase detector.

Thus, it is desirable to provide a phase detector design that reduces the amount of jitter in the VCO output when the PLL is in lock.

SUMMARY OF THE INVENTION

This and other aspects of the invention may be obtained generally in a phase-locked-loop having a variable frequency oscillator and a phase detector. The phase detector provides an UP output signal and a DOWN output signal depending on the relative phase difference between said oscillator output and a reference signal. A delay line is combined with the phase detector to delay one of said UP and DOWN outputs by an amount sufficient to have said outputs substantially overlap when the PLL is locked.

Alternatively, the aspects of the invention may also be obtained generally with a method of operating a phase-locked-loop, the phase-locked-loop having a variable frequency oscillator and a phase detector. The phase detector provides an UP output signal and a DOWN output signal depending on the relative phase difference between said oscillator output and a reference signal. Operation of the phase-locked loop is characterized by the step of delaying one of said UP and DOWN outputs by an amount sufficient to have said outputs substantially overlap when the PLL is locked.

BRIEF DESCRIPTION OF THE DRAWING

The foregoing features of this invention, as well as the invention itself, may be more fully understood from the following detailed description of the drawings, in which.

DETAILED DESCRIPTION

Figure 1:
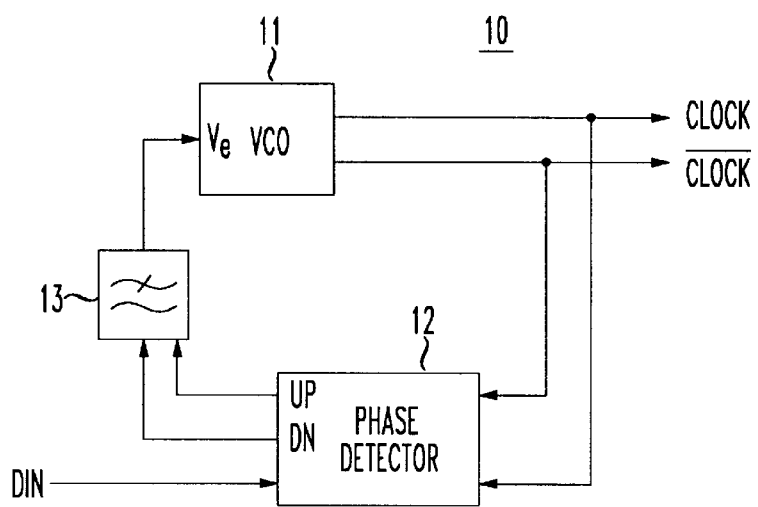
FIG. 1 is a simplified block diagram of a PLL.
Figure 2:
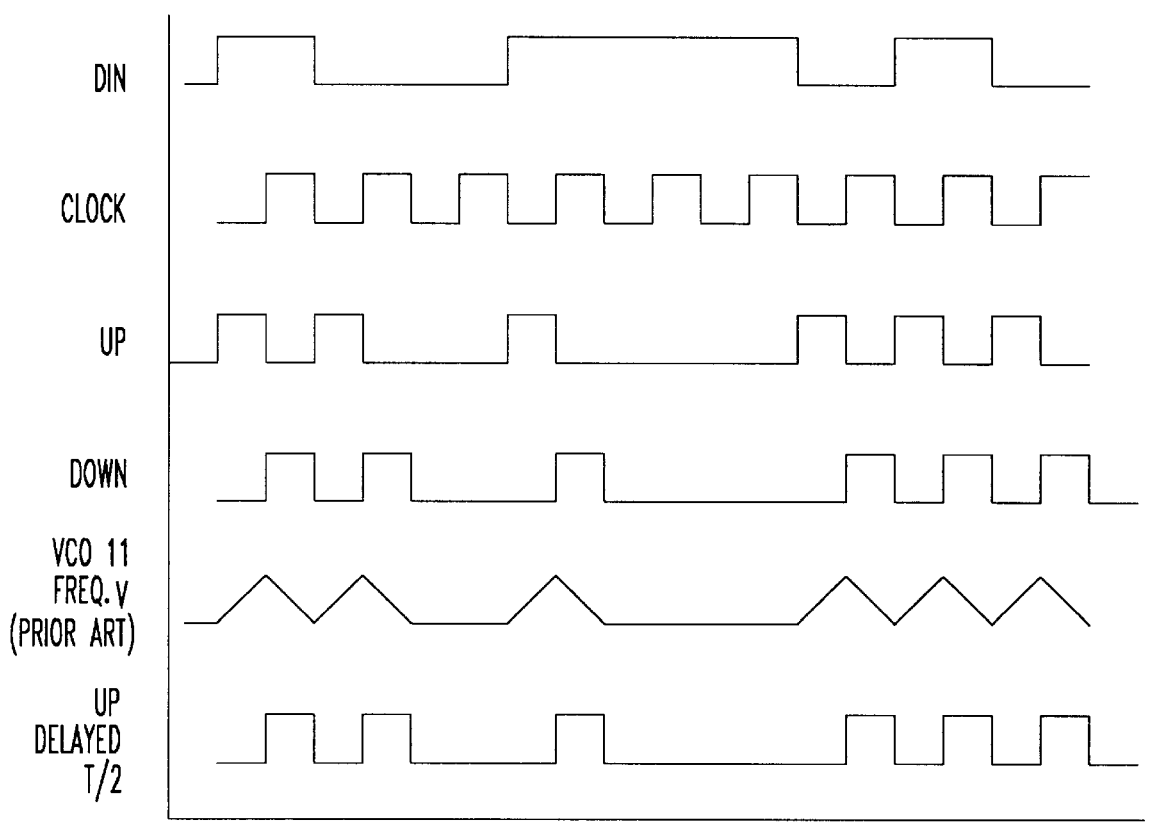
FIG. 2 is a simplified timing diagram illustrating the operation of a PLL using both a prior art phase detector (FIG. 3) and a phase detector according to the invention.

Generally, the invention may be understood by referring to FIGS. 1 and 2. FIG. 1 diagrams a conventional phase-locked-loop (PLL) 10 as having a frequency controlled oscillator 11 (also referred to as a voltage controlled oscillator or VCO), a phase detector 12, and a loop filter 13. The oscillator 11 has two opposite phase outputs in this example, CLOCK and $\overline{\text{CLOCK}}$, and an input $V_c$ which controls the frequency of the oscillator 11. The oscillator outputs, CLOCK and $\overline{\text{CLOCK}}$, form the output of the PLL 10 and drive phase detector 12. Detector 12 compares the output of oscillator 11 and an input signal applied to input DIN. Loop filter 13 takes the phase difference information from detector 12, labeled here as signals UP and DOWN (to be described in detail below), producing a signal for the frequency control of the oscillator 11 and completing a closed loop. As is well understood in the art, the frequency of the output of the PLL 10, when in lock, is substantially equal to the frequency of a signal applied to the input DIN. For example, the input signal may be a data signal and the PLL 10 acquires and locks onto the transitions in the data signal so that the output frequency of the PLL 11 substantially matches the frequency of the data signal. Moreover, the phase difference between the input signal and the output of the PLL 11, when in lock, is a substantially fixed amount and, for purposes here, is π radians for proper phase alignment when sampling the NRZ input signal shown in FIG. 2 (or π/2 radians for an RZ input signal) by a receiver (not shown). Note that any fixed phase difference may be chosen.

As mentioned above, the phase detector 12 measures the phase difference between the input signal and the output of the PLL 10. The kind of phase detector shown here is known as a Hogge detector (the digital portion of which is diagrammed in FIG. 3) and described fully in the above-referenced paper by C. R. Hogge, Jr. For purposes here, the difference in pulse widths between the UP and DOWN outputs from the detector 12 indicate the phase difference between the oscillator output and the input signal. Alternatively, the outputs can be thought of as providing phase error signals used to adjust the output of oscillator 11 into the desired phase alignment with the input signal. It should be noted that the terms "frequency" (measured in radians per second) and "phase" (measured in radians) describing the output signal from the PLL 10 are closely related and in this context are used interchangeably.

As illustrated in FIG. 2, the UP and DOWN signals are digital signals (fixed amplitudes but may have different widths) and are paired, i.e., both signals are asserted (pulsed high) in response to a transition in the input signal DIN. For purposes here, an UP pulse causes the oscillator 11 to increase in frequency while a DOWN pulse causes the oscillator 11 to decrease in frequency. The loop filter 13 (typically containing a low-pass filter and a subtractor) combines the UP and DOWN pulses into a single control signal driving the oscillator 11 input $V_c$.

When the PLL 10 (FIG. 1) is in lock, then the length of the UP and DOWN pulses are of substantially equal value, although displaced in time, resulting in the oscillator 11 having a net change in frequency and phase of zero. However, as illustrated in FIG. 2 and discussed above, the prior art Hogge phase detector 12 causes the oscillator frequency and phase to change in response for each UP or DOWN pulse. This introduces undesirable jitter in the output signal from the PLL 10.

To address this jitter problem, a delay line is combined with the phase detector to delay one of the UP and DOWN signals by an amount sufficient to have the signals substantially overlap when the PLL 10 is in lock. Thus, the UP and DOWN signals cancel each other out and no substantial change in the oscillator frequency/phase occurs, reducing jitter. As shown for one embodiment, the cancellation is accomplished by delaying the UP signal by one-half the clock period T as generated by oscillator 10. Alternatively, the phase detector 12 may be modified as shown in FIG. 5 to generate the DOWN signal which overlaps the UP signal.

Figure 3:
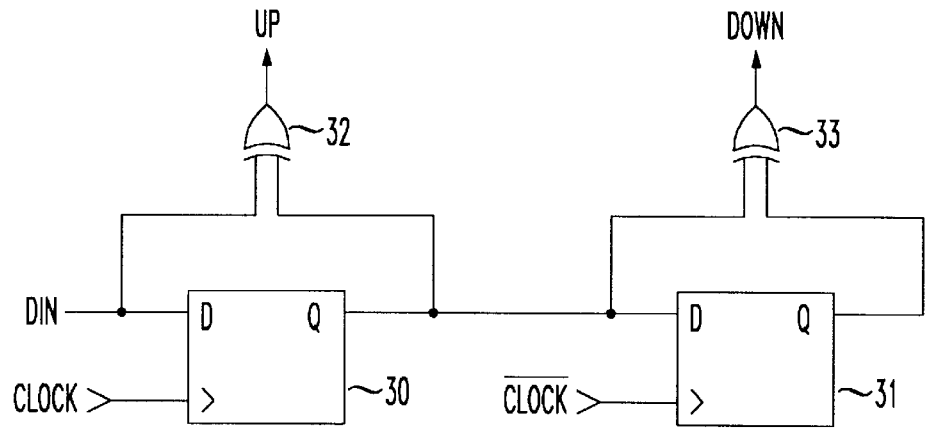
FIG. 3 is a simplified schematic diagram of a prior art phase detector used in the PLL of FIG. 1.
Figure 4:
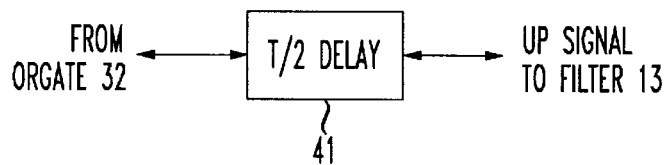
FIG. 4 is a simplified block diagram of a delay which, when added to the prior art phase detector of FIG. 3, forms an exemplary embodiment of the invention.

In more detail and in accordance with one embodiment of the invention, the prior art phase detector 12 shown in FIG. 3 is modified with the delay 41 shown in FIG. 4. As explained above, the phase detector 12 provides two outputs, UP and DOWN for controlling the oscillator 11 (FIG. 1). This exemplary type of phase detector, mentioned above as a Hogge detector, utilizes two serially coupled D-type flip-flops 30, 31, each clocked with opposite phases from the oscillator 11. Flip-flop 30 samples the input signal on input DIN and flip-flop 31 reclocks the sample held in flip-flop 30. Exclusive OR gates 32, 33 logically combine the signals on the inputs and outputs of the corresponding flip-flops. Outputs of gates 32, 33 are the signals UP and DOWN, respectively. By adding a delay element 41 (FIG. 4) with a delay of approximately T/2 (one-half the clock period T of the oscillator 11 output) to the output of EX-OR gate 32, the UP signal is delayed sufficiently to overlap the DOWN signal, giving rise to the advantage discussed above. Preferably, the delay element 41 is a delay line formed in the same integrated circuit with the oscillator 11 (FIG. 1) to assure a close match in delay with temperature, processing, operating frequency, etc. variations. This will be disclosed in more detail in connection with FIGS. 6 and 7.

Figure 5:
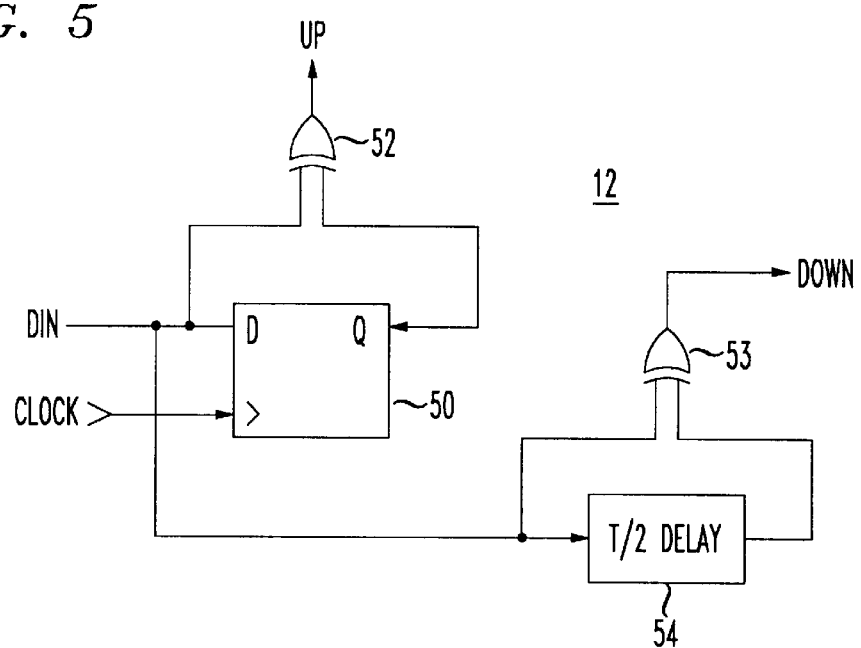
FIG. 5 is a simplified schematic diagram of an alternative embodiment of the invention.

An alternative approach to creating the phase detector 12 with overlapping UP and DOWN signals is illustrated in FIG. 5. The UP signal is generated in the same manor as shown in FIG. 3, where the flip-flop 50 and EX-OR gate 52 correspond to flip-flop 30 and EX-OR gate 32 in FIG. 3. Instead of using a flip-flop, the DOWN signal is generated by EX-ORing the input signal from DIN with a T/2 delayed version of the same input signal. Here a delay line 54 provides the T/2 delay and EX-OR gate 53 logically combines the input to the delay line 54 with the output thereof. The result is substantially the same as the phase detector 12 of FIGS. 3 and 4 except that instead of directly delaying the UP signal, the DOWN signal is generated in a way that makes the DOWN signal overlap the UP signal.

While the Hogge phase detector is disclosed in these embodiments, other phase detector designs may be used that can take advantage of the above-described pulse overlapping technique to reduce jitter.

Figure 6:
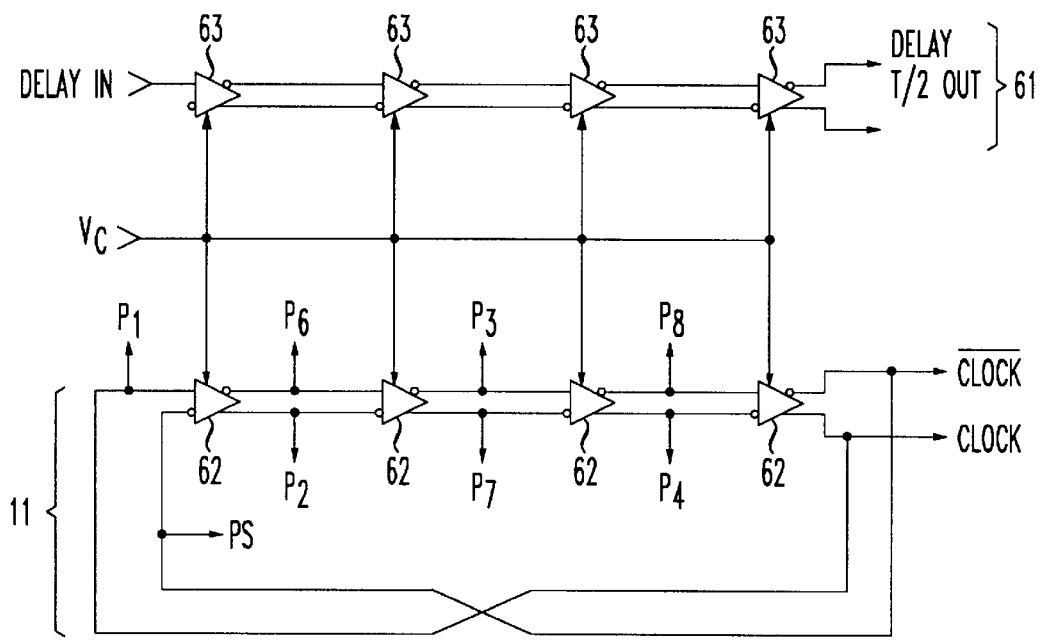
FIG. 6 is a simplified schematic diagram of an exemplary embodiment of a voltage controlled ring oscillator for a PLL with a matching delay line.
Figure 7:
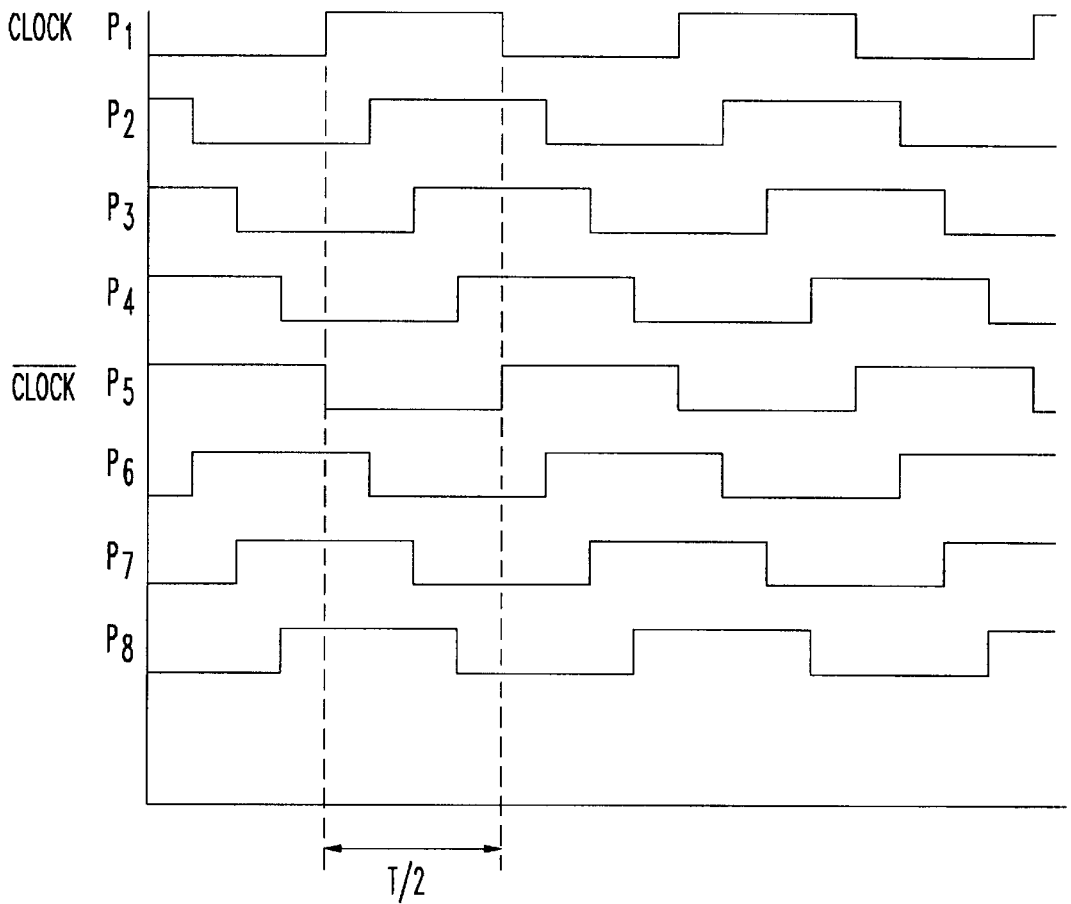
FIG. 7 is a simplified timing diagram illustrating the operation of the ring oscillator and delay line of FIG. 6.

In FIG. 6 an embodiment of a delay line 61 used as the delay 41 (FIG. 4) or delay 54 (FIG. 5), combined with the oscillator 11 (FIG. 1), is diagrammed. The oscillator 11 comprises a ring of series-coupled differential gates 62. The propagation delay of each gate 62 is controlled by a signal applied to input $V_c$. Such gates are disclosed in U.S. patent application Ser. No. 08/509073, by K. R. Lakshmikumar, assigned to the same assignee as this invention and incorporated herein by reference. The ring of gates 62 forms a ring oscillator, well known in the art. Operation of the ring oscillator 11 is diagrammed in FIG. 7, illustrating exemplary waveforms found at the various taps P1–P8 in the oscillator 11. Note that because of the differential operation of the gates 62 and the loop oscillator arrangement, the output pairs from each gate 62 have substantially opposite phase.

To provide a very tightly controlled and precise T/2 delay, exemplary series-coupled differential gates 63 are provided and controlled by the same control signal used to control the oscillator 11. It is preferable, but not essential, that the gates 63 are substantially identical to the gates 62 and are preferably formed in the same substrate to provide as close a match as possible. Also it is preferable, but not essential, that there are the same number of gates in both the delay line 61 and oscillator 11 for better matching.

It is understood that other types of controlled gates and oscillator/delay circuit topologies may be used to implement the oscillator 11 and delay 61, such as MOSFET-C designs, current starved inverters, acoustic and piezoelectric delay elements and oscillators, etc.

Having described the preferred embodiment of this invention, it will now be apparent to one of skill in the art that other embodiments incorporating its concept may be used. Therefore, this invention should not be limited to the disclosed embodiment, but rather should be limited only by the spirit and scope of the appended claims.

I claim:

1. In an integrated circuit, a phase-locked loop having:
   a variable frequency oscillator with an output and an input, the input for controlling the frequency of the oscillator;
   a phase detector for providing both an UP output signal and a DOWN output signal, each output signal having a pulse width that varies depending on the relative phase difference between said oscillator output and a reference signal, said UP and DOWN signals being coupled to said oscillator input;
   CHARACTERIZED BY:
   a delay line, combined with the phase detector, to delay one of said UP and DOWN outputs by an amount sufficient to have said outputs substantially overlap when the phase-locked loop is locked.

2. The phase-locked-loop as recited in claim 1, wherein said delay is substantially one-half the period of said oscillator output frequency.

3. The phase-locked-loop as recited in claim 2, wherein said delay line is disposed to delay said UP signal from said phase detector to said oscillator input.

4. The phase-locked-loop as recited in claim 3, further characterized by said delay line and said oscillator each being formed from substantially identical gates, all of said gates having variable propagation delay controlled from a common control input, the control input being the input of the oscillator.

5. The phase-locked-loop as recited in claim 4, further characterized by said oscillator being formed by a plurality of said gates disposed in a ring, and the delay line being formed by an equal number of said plurality of gates, said gates being disposed in series.

6. The phase-locked-loop as recited in claim 3, wherein the phase detector includes:

first and second serially coupled flip-flops, said first flip-flop transferring to its output when clocked a sample of said reference signal on its input, each flip-flop being clocked with opposite phases of said oscillator output;

a first logical combination of said reference signal and said first flip-flop output providing said UP signal; and a second logical combination of said first flip-flop output and an output of said second flip-flop generating said DOWN signal.

7. The phase-locked-loop as recited in claim 6, wherein the first and second logical combinations include exclusive OR gates.

8. The phase-locked-loop as recited in claim 2, wherein said delay line delays said reference signal and is further characterized by a first logical combination of said reference signal and said delayed reference signal generating said DOWN signal.

9. The phase-locked-loop as recited in claim 8, further characterized by said delay line and said oscillator each being formed from substantially identical gates, all of said gates having variable propagation delay controlled from a common control input, the control input being the input of the oscillator.

10. The phase-locked-loop as recited in claim 9, further characterized by said oscillator being formed by a plurality of said gates disposed in a ring, and the delay line being formed by an equal number of said plurality of gates, said gates being disposed in series.

11. The phase-locked-loop as recited in claim 8, wherein the phase detector further includes:

a flip-flop being clocked by said oscillator output, the flip-flop transferring to its output when clocked a sample of said reference signal on its input; and a second logical combination of said reference signal and said flip-flop output, generating said UP signal.

12. The phase-locked-loop as recited in claim 11, wherein the first and second logical combinations include exclusive OR gates.

13. A method of operating a phase-locked loop formed in an integrated circuit and having:

a variable frequency oscillator with an output and an input, the input for controlling the frequency of the oscillator;

a phase detector for providing both an UP output signal and a DOWN output signal, each output signal having a pulse width that varies depending on the relative phase difference between said oscillator output and a reference signal, said UP and DOWN signals being coupled to said oscillator input;

CHARACTERIZED BY THE STEP OF:

delaying one of said UP and DOWN outputs by an amount sufficient to have said outputs substantially overlap when the phase-locked loop is locked.

14. The method as recited in claim 13, wherein the amount of said delay is substantially one-half the period of said oscillator output frequency.

15. The method as recited in claim 14, further characterized by the steps of:

sampling said reference signal by a first flip-flop clocked by a phase of said oscillator output; and generating the UP signal by a first logical combination of said reference signal and said sampled reference signal.

16. The method as recited in claim 15, wherein the step of delaying is characterized by the step of:

delaying said UP signal from said phase detector to said oscillator.

17. The method as recited in claim 15, further characterized by the steps of:

reclocking said sampled reference signal with a second flip-flop clocked by a phase of said oscillator output opposite that clocking said first flip-flop; and generating the DOWN signal by a second logical combination of said sampled reference signal and said reclocked sampled reference signal.

18. The method as recited in claim 17, wherein said first and second logical combinations include the exclusive OR function.

19. The method as recited in claim 15, wherein the step of delaying is characterized by the steps of:

delaying said reference signal; and generating the DOWN signal by a second logical combination of said reference signal and said delayed reference signal.

20. The method as recited in claim 19, wherein said first and second logical combinations include the exclusive OR function.

* * * * *